(12) United States Patent
Waltari et al.

(10) Patent No.: US 9,019,137 B1
(45) Date of Patent: Apr. 28, 2015

(54) MULTIPLYING DIGITAL-TO-ANALOG CONVERTER

(71) Applicant: IQ-Analog Corporation, San Diego, CA (US)

(72) Inventors: Mikko Waltari, Escondido, CA (US); Michael Kappes, San Diego, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 14/158,299

(22) Filed: Jan. 17, 2014

(51) Int. Cl.
   H03M 1/66   (2006.01)
   H03M 1/08   (2006.01)
   H03M 1/70   (2006.01)
   H03M 1/80   (2006.01)

(52) U.S. Cl.
   CPC .............. *H03M 1/0872* (2013.01); *H03M 1/70* (2013.01); *H03M 1/804* (2013.01)

(58) Field of Classification Search
   CPC ..... H03M 1/167; H03M 1/804; H03M 1/164; H03M 1/069; H03M 1/44; H03M 1/785; H03M 1/0624; H03M 1/0604; H03M 1/1215; H03M 1/1061; H03M 1/361; H03M 1/806; H03M 1/0653; H03M 1/0682; H03M 1/162; H03M 1/74
   USPC ................................................. 341/140–165
   See application file for complete search history.

(56) References Cited

U.S. PATENT DOCUMENTS

| | | | | |
|---|---|---|---|---|
| 5,745,064 A | * | 4/1998 | Ohya | 341/144 |
| 5,815,046 A | * | 9/1998 | Spilker et al. | 341/144 |
| 5,835,039 A | * | 11/1998 | Giacomini | 341/144 |
| 6,489,904 B1 | | 12/2002 | Hisano | |
| 6,950,047 B1 | * | 9/2005 | Piasecki et al. | 341/144 |
| 7,116,255 B2 | | 10/2006 | Lee et al. | |
| 7,187,318 B1 | * | 3/2007 | Lee et al. | 341/161 |
| 7,522,085 B1 | | 4/2009 | Srinvasa et al. | |
| 8,581,769 B2 | | 11/2013 | Kumar et al. | |
| 8,711,026 B1 | * | 4/2014 | Kappes | 341/155 |
| 8,917,125 B1 | * | 12/2014 | Waltari | 327/147 |
| 2013/0033391 A1 | | 2/2013 | Liu et al. | |

* cited by examiner

*Primary Examiner* — Lam T Mai
(74) *Attorney, Agent, or Firm* — Law Office of Gerald Maliszewski; Gerald Maliszewski

(57) ABSTRACT

A charge canceling multiplying digital-to-analog converter (MDAC) is provided with a reference block having inputs to accept reference voltages each sample clock cycle. The MDAC includes a sampling block having inputs to accept differential analog input voltage signals each sample clock cycle. A differential amplifier has a negative input and positive input connected to the reference block and sampling block to receive differential amplifier input signals, and a positive output and a negative output to supply differential output voltage signals each amplify clock cycle. The sampling section includes a first pair of feedback capacitors connected between the differential amplifier negative input and positive output, and a second pair of feedback capacitors connected between the differential amplifier positive input and negative output each amplify clock cycle. A capacitor from the first pair of parallel feedback capacitors is swapped with a capacitor from the second pair prior to each sample clock cycle.

22 Claims, 14 Drawing Sheets

MULTIPLYING DIGITAL-TO-ANALOG CONVERTER

BACKGROUND OF THE INVENTION

1. Field of the Invention

This invention generally relates to analog-to-digital converters (ADCs) and, more particularly, to a multiplying digital-to-analog converter (MDAC) capable of minimizing charge kickback between sampling clock cycles.

2. Description of the Related Art

FIG. 1 is a schematic block diagram of a pipelined analog-to-digital converter (ADC) (prior art). The pipelined ADC uses analog preprocessing to divide the input range into sub-intervals and to amplify the signal inside them. The architecture has evolved by making use of the strengths of the switched capacitor technique, which provides very accurate and linear analog amplification and summation operations in the discrete time domain. As a result, a sawtooth-shaped transfer function can readily be realized. In a pipelined ADC, m units (pipeline stages) are cascaded. Each stage processes the same sample only for one clock cycle, after which it passes it to the next stage for further processing.

The principle in pipelined analog-to-digital (A/D) conversion is to find a set of reference voltages whose sum equals the signal sample being converted. This is realized by sequentially subtracting different reference voltages from the sample until the residue becomes zero, indicating that the sum of the subtracted references equals the original sample value. An analogy can be found in weighing flour on a pair of scales using a set of weights. The residue is amplified between the subtraction steps in order to increase accuracy. The final conversion result is the sum of the subtracted reference voltages.

A functional block diagram of one stage is shown in the inset 100. The incoming voltage is sampled by the sample-and-hold (S/H) circuit 102 and simultaneously digitized by the sub-ADC 104. The result of the A/D conversion is immediately converted back to analog form and subtracted from the sampled-and-held signal. The resulting residue voltage is amplified by Gi, which is nominally equal to 2 k. In a switched capacitor realization the S/H operation, the D/A conversion, the subtraction, and the amplification are all performed by a single circuit block called a multiplying digital-to-analog converter (MDAC), which consists of an opamp and a set of switched capacitors. The low resolution sub-ADC is usually a flash, consisting of a few comparators and logic gates.

A 9-bit ADC can be realized with the standard 1.5 bits-per-stage pipeline architecture, where the 0.5 bit redundancy in each stage is used for digital correction. Each pipeline stage performs a coarse (in this case three-level) A/D conversion for its input signal and passes the amplified quantization error to the next stage. The quantization error (or residue) is formed by converting the quantization result back to analog form and subtracting it from the input signal. The residue formation and its precise amplification are performed by the MDAC.

FIG. 2 is a schematic diagram of a conventional multiplying digital-to-analog converter (prior art). The operation of the pipeline stage consists of two phases each lasting half a clock cycle. As demonstrated using the two effective bit single-ended design, in the first (sample) clock phase the MDAC samples the input signal using capacitors 200 and 202, where reference designator 200 represents three equal-valued units 200 in parallel, while 202 is only one unit. The sub-ADC (not shown) does the A/D conversion and supplies a code signal. During the second (amplify) clock phase the MDAC generates and amplifies the residue, yielding the input signal for the next stage. The charge in the input capacitors 200 is transferred to the feedback capacitor 202. The D/A operation is realized by connecting capacitors 200 to the reference voltages according to the bit code produced by the sub A/D converter.

Returning to FIG. 1, a S/H circuit is often used in front of a pipelined ADC. A front-end S/H separates the sampling from the digitization allowing the designer better optimize it for the task. However, an additional circuit block without any gain in front of the ADC means that to achieve the same noise level than without it, the capacitor sizes in the ADC front-end must be increased. This, together with the additional S/H circuit power, leads to a significant power penalty.

In contrast, when the S/H circuit is omitted, the signal is sampled directly by the first ADC stage, which now is responsible for directly sampling the input signal and determining the load for the circuit driving the ADC. The task of the driver becomes especially hard if the current drawn by the ADC input has a nonlinear dependency on the input voltage. A dominant source of nonlinear input current is a charge kickback from the sampling capacitors when they are connected to the input to take a new sample.

Another related issue with the ADC has to do with reference voltages, which are used in the analog-to-digital conversion process. The accuracy of the reference voltage has a direct effect on the accuracy of the conversion. For this reason a significant amount of power is often used in the reference voltage drivers to provide references with low noise and low signal dependent ripple. The ADC is often driven by a circuit that uses a higher operating voltage than the ADC. For this reason the driver is capable of providing a higher signal swing than the ADC can support internally. While the internal analog signal swing in the ADC is limited by the supply voltage and the voltage headroom required by the active circuit elements such as the operational amplifiers, the ADC input signal has much smaller headroom requirements and could be higher. A higher input signal swing directly translates to a higher signal-to-noise ratio (SNR). The prior art MDAC structure fixes the ADC reference voltage, internal signal swing, and input signal swing all to same value.

It would be advantageous if the MDAC input current could be made more linear during the sample clock cycle by eliminating the charge kickback associated with the sampling capacitors.

It would be advantageous if the reference voltages could be made more stable by making the loading of the current drawn by the MDAC independent of the analog input signal. Further, it would be advantageous if the range of the reference voltages could be increased with respect to the MDAC analog output signal, while decreasing the reference capacitor sizes.

It would be advantageous if the MDAC reference voltages, internal signal swing, and analog output signal swing could be decoupled from each other and set independently.

SUMMARY OF THE INVENTION

Disclosed herein is a multiplying digital-to-analog converter (MDAC) that eliminates the need for a sample-and-hold (S/H) circuit. By minimizing charge kickback during the sample clock cycle circuit, the task of drive circuitry is simplified, eliminating the need for the S/H circuit. The MDAC disclosed herein makes the loading of the reference capacitors independent of the analog input signal, and doubles of the value of the reference voltage. The reference voltages are used twice in a clock period: once during the sample clock cycle and once during the amplify clock cycle. This allows the same amount of charge to be delivered by a capacitor of half the size, which improves the noise and the settling speed of the circuit. Further, while conventional MDAC structures fix the reference voltage, internal signal swing, and output signal swing all to the same value, the MDAC disclosed herein decouples all three and allows them to be set independently.

Accordingly, a charge canceling MDAC is provided with a reference block having inputs to accept reference voltages each sample clock cycle. The MDAC also includes a sampling block having inputs to accept differential analog input voltage signals each sample clock cycle. A differential amplifier has a negative input and positive input connected to the reference block and sampling block to receive differential amplifier input signals, and a positive output and a negative output to supply differential output voltage signals in each amplify clock cycle. The sampling section includes a first pair of feedback capacitors connected between the differential amplifier negative input and positive output, and a second pair of feedback capacitors connected between the differential amplifier positive input and negative output each amplify clock cycle. A capacitor from the first pair of parallel feedback capacitors is swapped with a capacitor from the second pair prior to each sample clock cycle. In this manner, the charges built up in the feedback capacitors are canceled before each new sample clock cycle.

The reference block includes reference capacitors to accept the reference voltages in each sample clock cycle independent of the differential analog input voltage signals, and a first switching section. The first switching section has an input to accept a code signal and switches to selectively connect the reference capacitors to the differential amplifier inputs in response to the code signal each amplify clock cycle. More explicitly, switches selectively connect, in each amplify clock cycle, positive (+Vref) and negatively (−Vref) charged reference capacitors to the differential amplifier positive input, the differential amplifier negative input, or a neutral reference voltage, in response to the code signal. The sampling section further includes a first input capacitor and a second input capacitor to accept the differential analog input voltage signal each sample clock cycle. A second switching section swaps the capacitor from the first pair of feedback capacitors with the capacitor from the second pair of feedback capacitors prior to every sample clock cycle. The second switching section also connects the first and second input capacitors, respectively, to the negative and positive inputs of the differential amplifier each amplify clock cycle, and connects the first and second pair of feedback capacitors to the differential amplifier each amplify clock cycle. In one alternative, a single feedback capacitor is used instead of the first pair of feedback capacitors, and a single feedback capacitor is used instead of the second pair of feedback capacitors. In this aspect, there is no swapping of feedback capacitors between sample clock cycles.

In one aspect, the first and second pair of feedback capacitors accept the differential analog voltage input signal at their first terminals, in each sample clock cycle, while their second terminals accept a neutral reference voltage. In other variations, the reference capacitors whose first terminals were positively charged (+Vref) in the sample clock cycle are connected to (−Vref) each amplify clock cycle. Likewise, the first terminal of each reference capacitor that was negatively charged (−Vref) in the sample clock cycle is connected to +Vref each amplify clock cycle. Alternatively, the first terminal of each positive reference capacitor is connected to the first terminal of a corresponding negative reference capacitor in each amplify clock cycle.

Additional details of the above-described MDAC are presented below.

DETAILED DESCRIPTION

Figure 1:
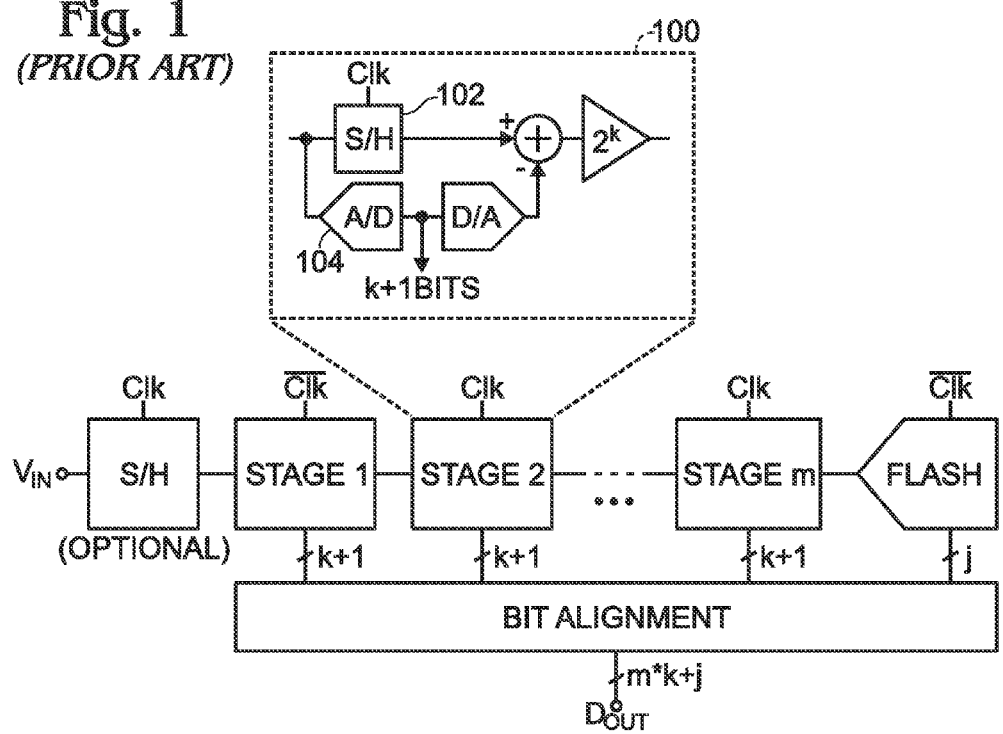
FIG. 1 is a schematic block diagram of a pipelined analog-to-digital converter (ADC) (prior art).
Figure 2:
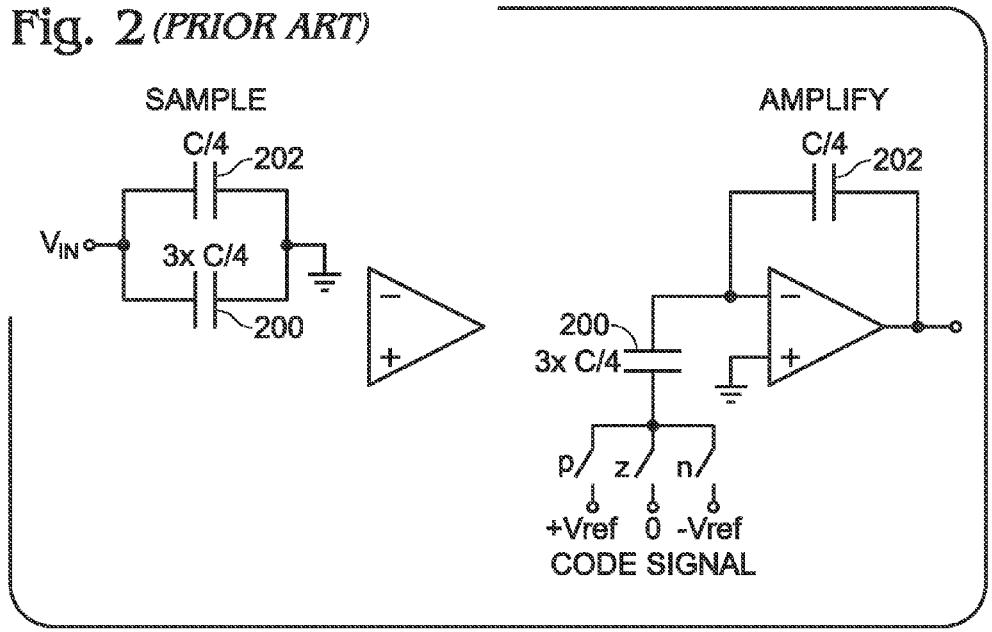
FIG. 2 is schematic diagram of a conventional multiplying digital-to-analog converter (prior art).
Figure 3A:
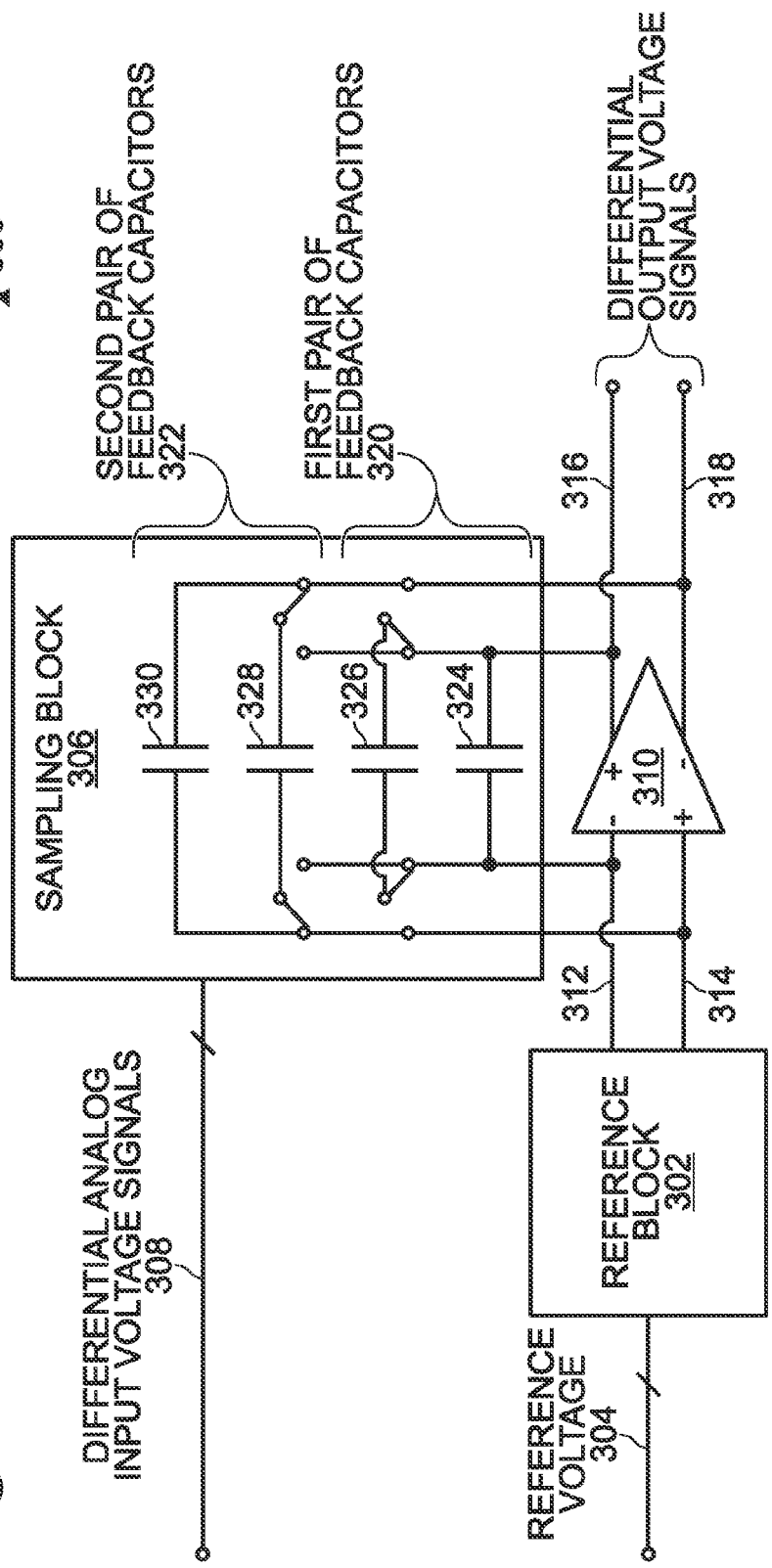
FIGS. 3A and 3B are schematic block diagrams of a charge canceling multiplying digital-to-analog converter (MDAC).
Figure 3B:
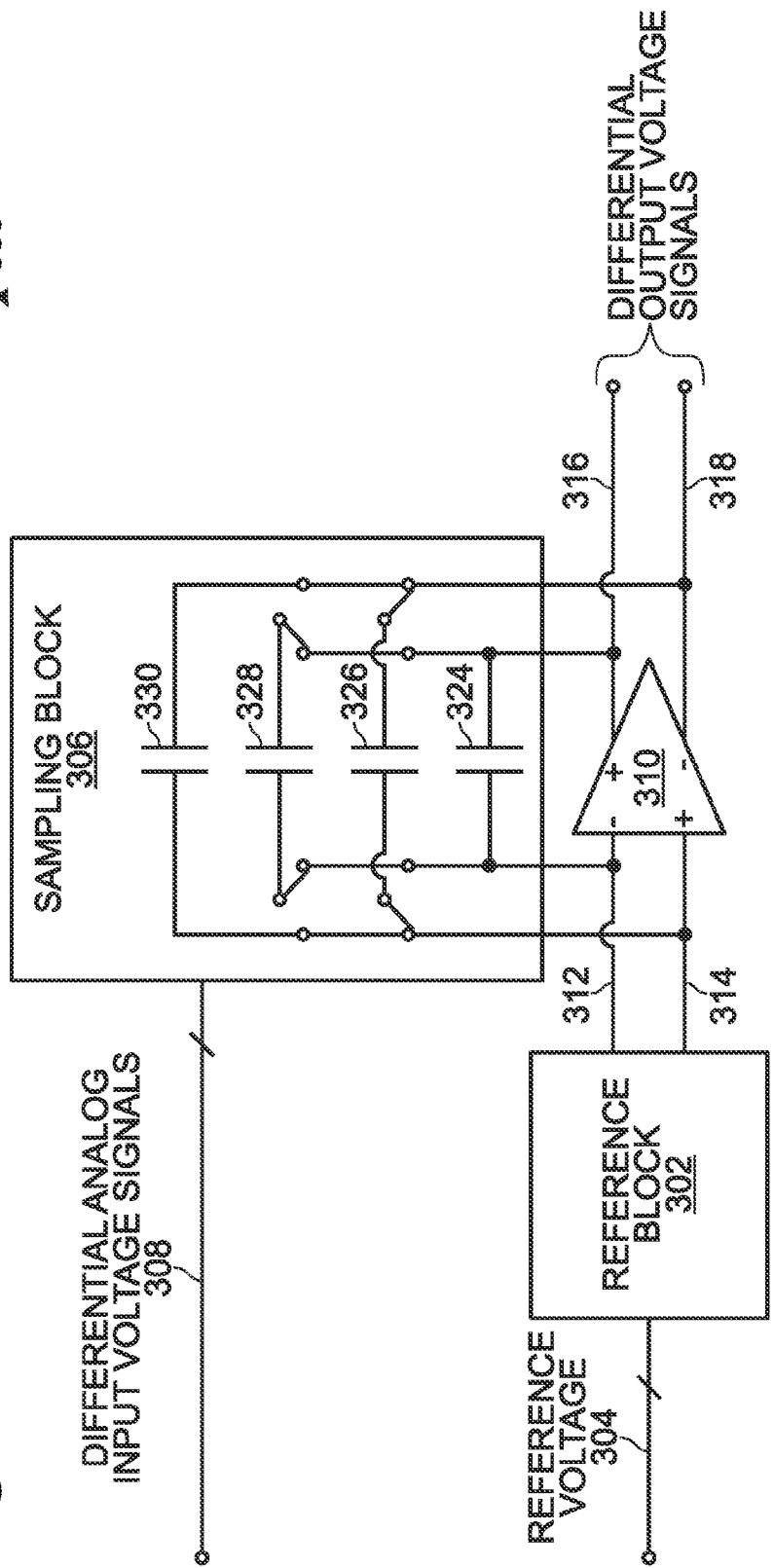

FIGS. 3A and 3B are schematic block diagrams of a charge canceling multiplying digital-to-analog converter (MDAC). The MDAC 300 comprises a reference block 302 having inputs on line 304 to accept reference voltages each sample clock cycle. A sampling block 306 has inputs on line 308 to accept differential analog input voltage signals each sample clock cycle. A differential amplifier 310 has a negative input on line 312 and positive input on line 314 connected to the reference block 302 and sampling block 306 to receive differential amplifier input signals. The differential amplifier 310 has a positive output on line 316 and a negative output on line 318 to supply differential output voltage signals in each amplify clock cycle. The sampling block 306 comprises a first pair of feedback capacitors 320 connected between the differential amplifier negative input on line 312 and positive output on line 316, and a second pair of feedback capacitors 322 connected between the differential amplifier positive input on line 314 and negative output on line 318 each amplify clock cycle. A capacitor from the first pair of feedback capacitors 320 is swapped with a capacitor from the second pair of feedback capacitors 322 prior to each sample clock cycle. The operational amplifier in the negative feedback configuration as described above creates a virtual ground (zero or nearly zero voltage and infinite or very high impedance) between its input terminals. This forces charge transfer from the input capacitors and the reference capacitors into the feedback capacitors resulting in a differential output voltage across the feedback capacitor terminals that are connected to the operational amplifier outputs.

More explicitly, the first pair of feedback capacitors 320 comprise a first feedback capacitor 324 and a second feedback capacitor 326, engaged between the differential amplifier negative input on line 312 and positive output on line 316, each developing a charge in a first amplify clock cycle, as shown in FIG. 3A. The second pair of feedback capacitors 322 comprise a third feedback capacitor 328 and a fourth feedback capacitor 330, engaged between the differential amplifier positive input on line 314 and negative output on line 318, each developing a charge in the first amplify clock cycle, as shown in FIG. 3A. In FIG. 3B, the first pair of feedback capacitors comprise the first feedback capacitor 324 and third feedback capacitor 328, engaged between the differential amplifier negative input on line 312 and positive output on line 316, respectively canceling their charges prior to a second sample clock cycle. The second pair of feedback capacitors comprise the second feedback capacitor 326 and fourth feedback capacitor 330, engaged between the differential amplifier positive input on line 314 and negative output on line 318, respectively canceling their charges prior to the second sample clock cycle. Typically, the first capacitor 324, second capacitor 326, third capacitor 328, and fourth capacitor 330 have equivalent capacitance values.

Figure 4A:
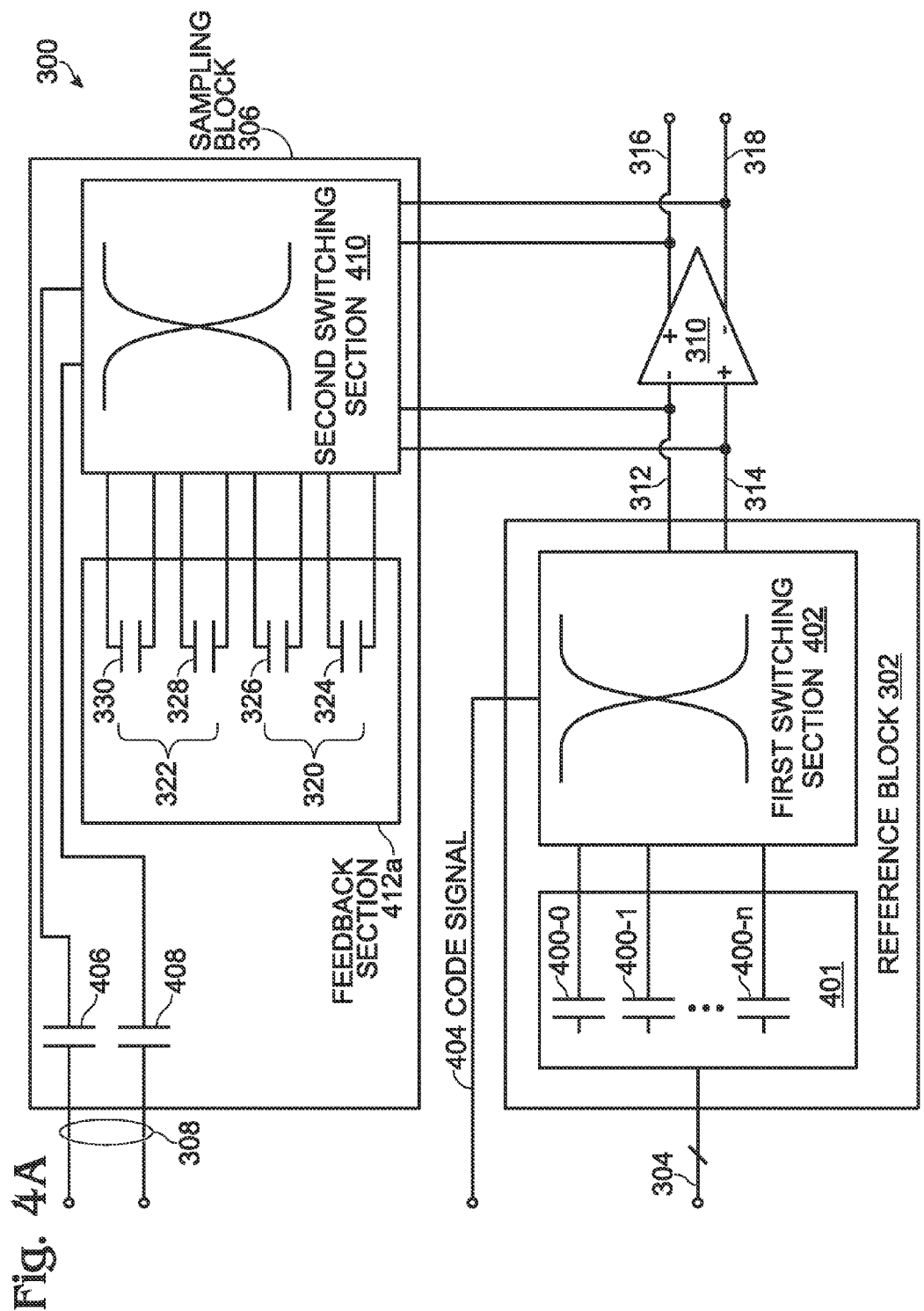
FIGS. 4A and 4B are schematic block diagrams depicting the MDAC in greater detail.
Figure 4B:
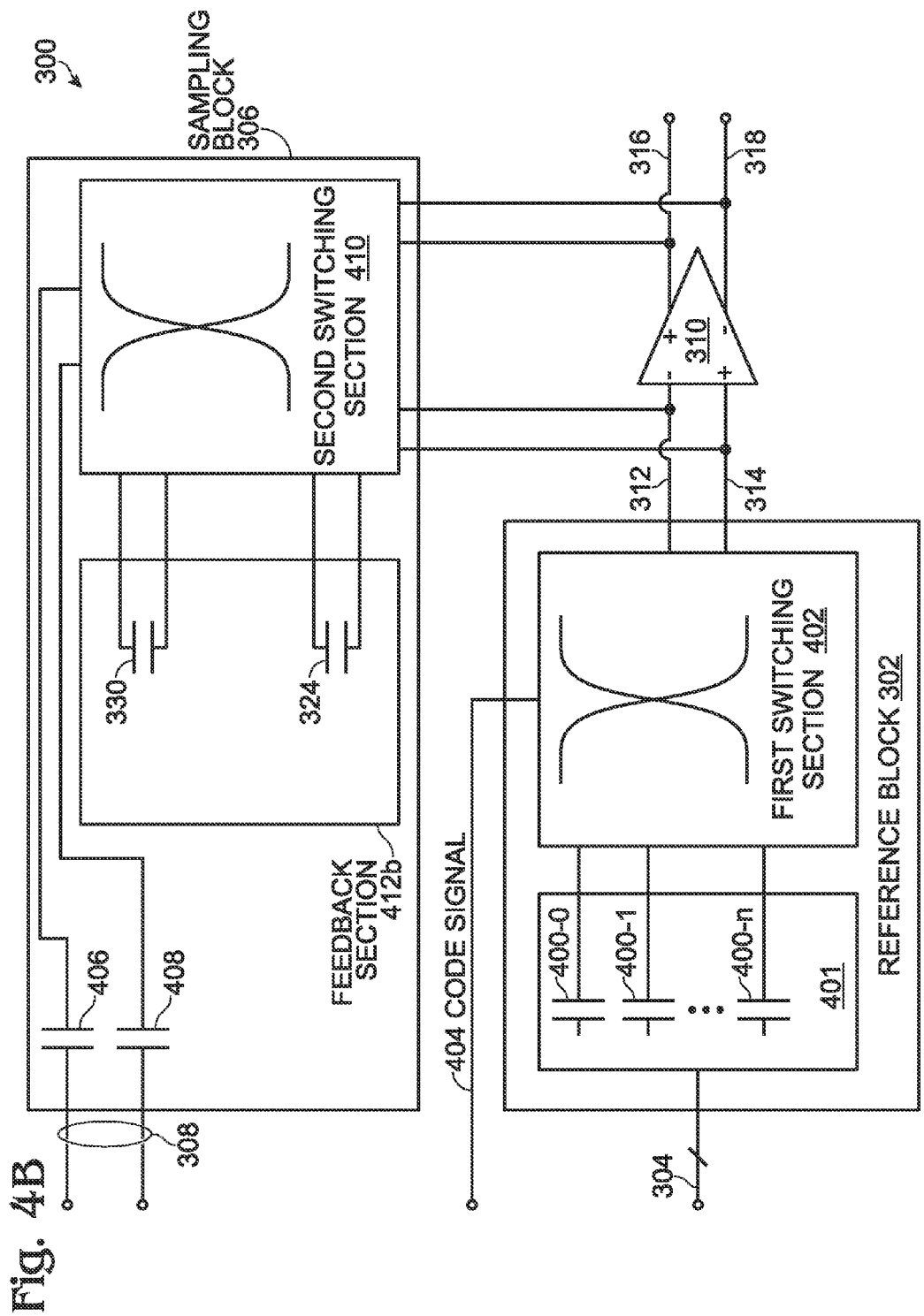

FIGS. 4A and 4B are schematic block diagrams depicting the MDAC in greater detail. The reference block 302 comprises reference capacitor section 401 with reference capacitors 400-0 through 400-$n$, where n is an integer greater than or equal to 1. The reference capacitors 400-0 through 400-$n$ accept the reference voltages on line 304 in each sample clock cycle, independent of the differential analog input voltage signals on line 308. A first switching section 402 has an input on line 404 to accept a code signal and switches to selectively connect the reference capacitors 400-0 through 400-$n$ to the differential amplifier inputs on lines 312 and 314 in response to the code signal on line 404 each amplify clock cycle. For simplicity, the first switching section 402 is represented here as a crossbar switch capable of a multitude of simultaneous input and output connections.

The sampling block 306 further comprises a first input capacitor 406 and a second input capacitor 408 to accept the differential analog input voltage signal on line 308 each sample clock cycle. A second switching section 410 swaps the capacitor (e.g. second feedback capacitor 326) from the first pair of feedback capacitors 320 with the capacitor (e.g. third feedback capacitor 328) from the second pair of feedback capacitors 322 prior to every sample clock cycle. For simplicity, the first feedback capacitor 324, second feedback capacitor 326, third feedback capacitor 328, and fourth feedback capacitor 330 are grouped together in feedback section 412$a$. Also for simplicity, the second switching section 410 is represented as a crossbar switch capable of multiple simultaneous input and output connections, but it should be understood that the second switching section may be enabled to connect the feedback capacitors as shown in FIGS. 3A and 3B. The second switching section 410 also connects the first input capacitor 406 and second input capacitors 408, respectively, to the negative and positive inputs on lines 312 and 314 of the differential amplifier 310 each amplify clock cycle. Further, the second switching section connects the first pair of feedback capacitors 320 and the second pair of feedback capacitors 322 to the differential amplifier 310 each amplify clock cycle, as explained above in the description of FIGS. 3A and 3B.

FIG. 4B depicts the MDAC of FIG. 4A with a simplified feedback section. Feedback section 412$b$ includes first feedback capacitor 324 and fourth feedback capacitor 330. In this aspect, the second switching section 410 connects the first feedback capacitor 324 between the differential amplifier negative input on line 312 and positive output on line 316, and the fourth feedback capacitor 330 between the differential amplifier positive input on line 314 and negative output on line 318 each amplify clock cycle. In contrast to the feedback section of FIG. 4A (412$a$), feedback section 412$b$ does not comprise pairs of feedback capacitors, where one capacitor from each pair is swapped prior to every sample clock cycle.

Figure 5:
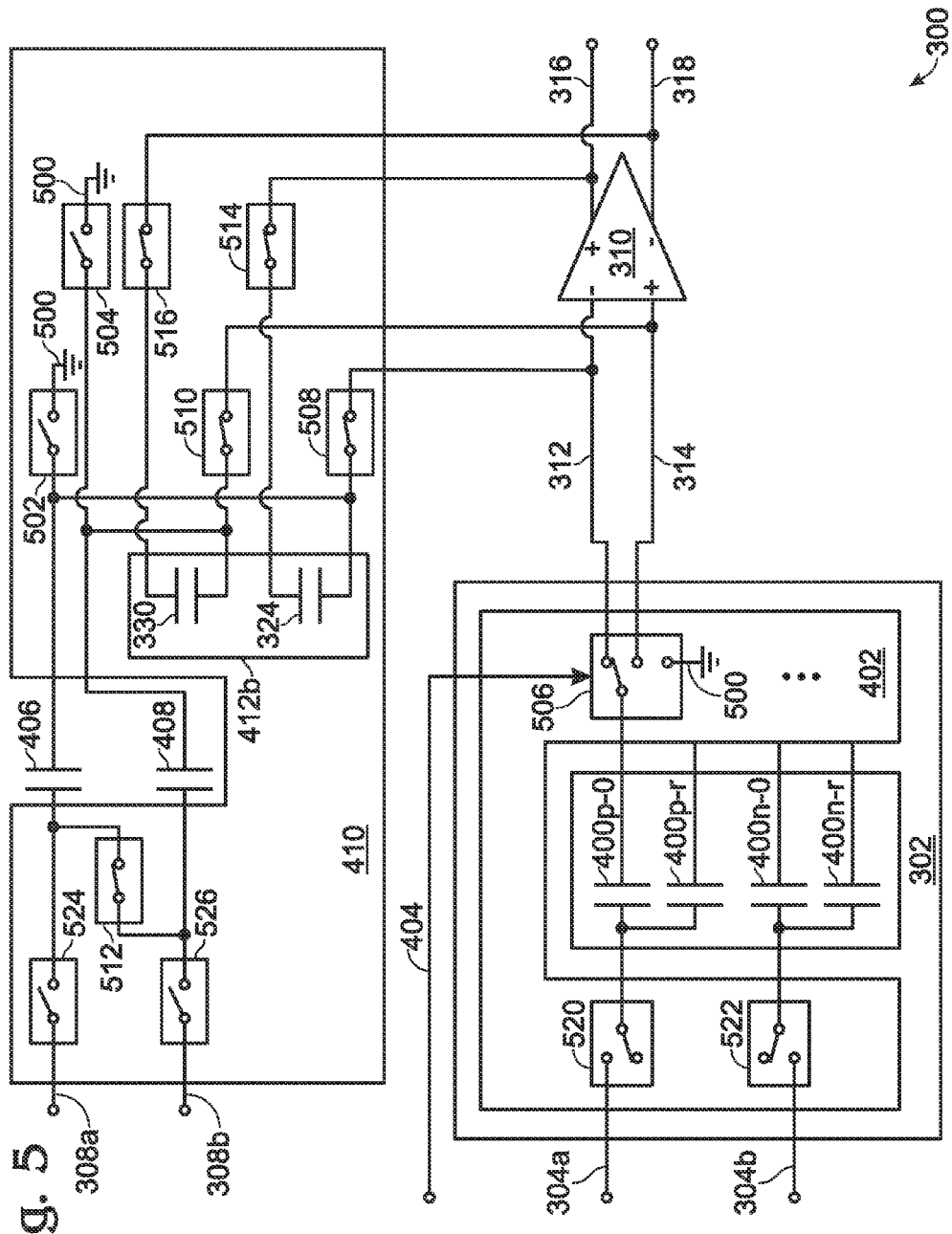
FIG. 5 is a schematic block diagram depicting the MDAC of FIG. 4B in yet greater detail.

FIG. 5 is a schematic block diagram depicting the MDAC of FIG. 4B in yet greater detail. The reference capacitors section 401 comprises a first plurality of positive reference capacitors 400$p$-0 through 400$p$-$r$, where r is an integer greater than or equal to zero. In this example, r is equal to two. The positive reference capacitors 400$p$-0 through 400$p$-$r$ each have a first terminal to accept a positive reference voltage (+Vref) on line 304$a$ and a second terminal to accept a neutral reference voltage on line 500 in each sample clock cycle. For example, +Vref is supplied to positive reference capacitors 400$p$-0 and 400$p$-$r$ via switch 520, and the neutral voltage is supplied to positive reference capacitor 400$p$-0 via switch 506. Likewise, the reference capacitors section 401 comprises a first plurality of negative reference capacitors 400$n$-0 through 400$n$-$r$. The negative reference capacitors 400$n$-0 through 400$n$-$r$ each have a first terminal to accept a negative reference voltage (−Vref) on line 304$b$ via switch 522 and a second terminal to accept a neutral reference voltage in each sample clock cycle. For the sake of simplicity, no switches are shown connected to second terminals of reference capacitors 400$p$-$r$, 400$n$-0, and 400$n$-$r$. The switches described herein may be enabled using transistors or microelectromechanical system (MEMS) devices as gating mechanisms, but are not limited to any particular means of enablement.

The first input capacitor 406 has a first terminal to accept a positive differential analog voltage input signal (+Vin) on line 308$a$ in each sample clock cycle. The second switching section 410 has a first switch 502 to connect a second terminal of the first input capacitor 406 to a neutral reference voltage on line 500 in each sample clock cycle. The second input capacitor 408 has a first terminal to accept a negative differential analog voltage input signal (−Vin) on line 308$b$ in each sample clock cycle. The second switching section 410 has a second switch 504 to connect a second terminal of the second input capacitor 408 to a neutral reference voltage on line 500 in each sample clock cycle.

The first switching section 402 comprises a plurality of switches to selectively connect, in each amplify clock cycle, the second terminal of each positive and negative reference capacitor to one of the following nodes in response to the code signal on line 404: the differential amplifier positive input on line 314, the differential amplifier negative input on line 312, or a neutral reference voltage on line 500. For simplicity only a single such switch 506 is shown, associated with positive reference capacitor 400$p$-0. However, it should be understood that one such switch exists for every reference capacitor. The code signal on line 404 directs the reference capacitors to be independently connected to the differential amplifier inputs via switches, such as switch 506. Note: although all the above-mentioned neutral reference voltages have been designated as associated with line 500, and marked as ground for simplicity, they need not necessarily be connected to a common node and the neutral reference voltage need not necessarily be a ground, as explained in more detail below.

The second switching section comprises a third switch 508 connecting the second terminal of the first input capacitor 406 and the second terminal of the first feedback capacitor 324 to the differential amplifier negative input on line 312 in each amplify clock cycle. A fourth switch 510 connects the second terminal of the second input capacitor 408 and the second terminal of the fourth feedback capacitor 330 to the differential amplifier positive input on line 314 in each amplify clock cycle. A fifth switch 512 connects the first terminal of the first input capacitor to the first terminal of the second input capacitor in each amplify clock cycle. Each amplify clock cycle, switches 524 and 526 respectively disconnect the first terminals of capacitors 406 and 408 from their inputs on lines 308a and 308b. A sixth switch 514 connects the first terminal of the first feedback capacitors 324 to the differential amplifier positive output on line 316 in each amplify clock cycle. A seventh switch 516 connects the first terminal of the fourth feedback capacitors 330 to the differential amplifier negative output on line 318 in each amplify clock cycle. Note: in these figures the switches that enable the swapping of capacitors between the first and second pairs of feedback capacitors are not shown for the sake of simplicity. Note: all switches are depicted in their amplify cycle positions.

In one aspect, the positive reference capacitors 400p-0 through 400p-r first terminals accept a constant uniform values of +Vref on line 304a in all sample clock cycles. Likewise, the negative reference capacitors 400n-0 through 400n-r accept a constant uniform value of –Vref on line 304b in all sample clock cycles. In another aspect, a first voltage potential is defined between +Vref and –Vref each sample clock cycle, and the differential amplifier 310 supplies a differential output voltage signal +Vout and –Vout on lines 316 and 318 in each amplify clock cycle having a second maximum voltage potential, less than the first voltage potential.

Figure 6A:
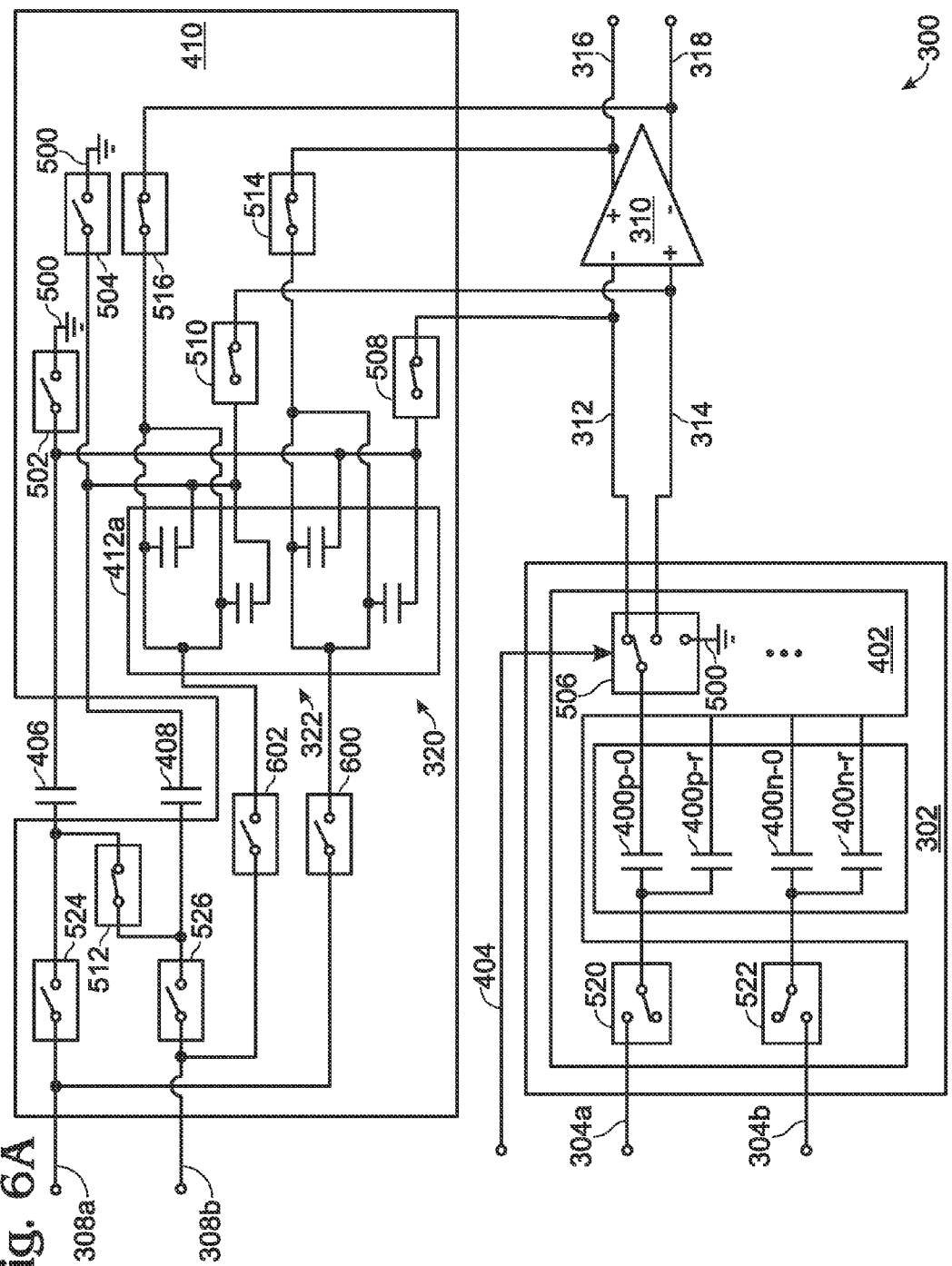
FIGS. 6A and 6B are schematic block diagrams respectively depicting the MDAC of FIG. 5 with a first variation in feedback capacitor sampling.
Figure 6B:
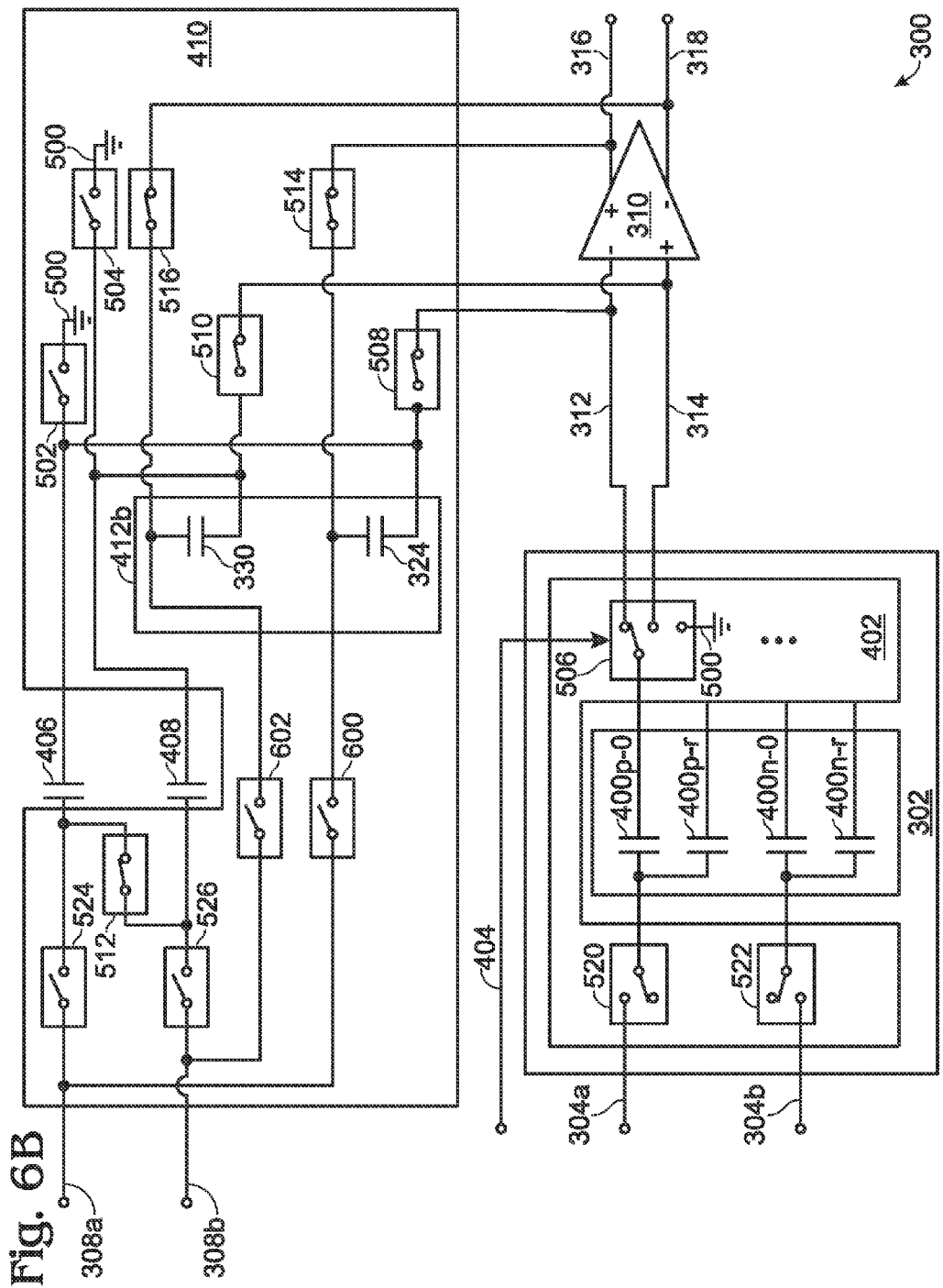

FIGS. 6A and 6B are schematic block diagrams respectively depicting the MDAC of FIG. 5 with a first variation in feedback capacitor sampling. In FIG. 6A, the first terminals of the first pair of feedback capacitors 320 accept +Vin through eighth switch 600 and the second terminals accept a neutral reference voltage on line 500 via switch 502 in each sample clock cycle. Likewise, the first terminals of the second pair of feedback capacitors 322 accept –Vin via ninth switch 602 and the second terminals accept a neutral reference voltage on line 500 via switch 504 in each sample clock cycle. Again, all switches are shown in the amplify clock cycle positions, and the switches that enable capacitors to be swapped between the first and second pair of feedback capacitors are not shown. Note: although each connection function is described as being associated with a corresponding switch, in some aspects multiple connection functions can be combined in a single switch. For example, switch 502 could be enabled to connect to the neutral reference voltage 500 in the sample clock cycle, and connect the second terminals of the first pair of feedback capacitors 320 to line 312 in the amplify clock cycle. shown)

FIG. 6B depicts the MDAC of FIG. 6A with a simplified feedback section 412b. As noted above, feedback section 412b does not comprise pairs of feedback capacitors, where one capacitor from each pair is swapped prior to every sample clock cycle.

Figure 7:
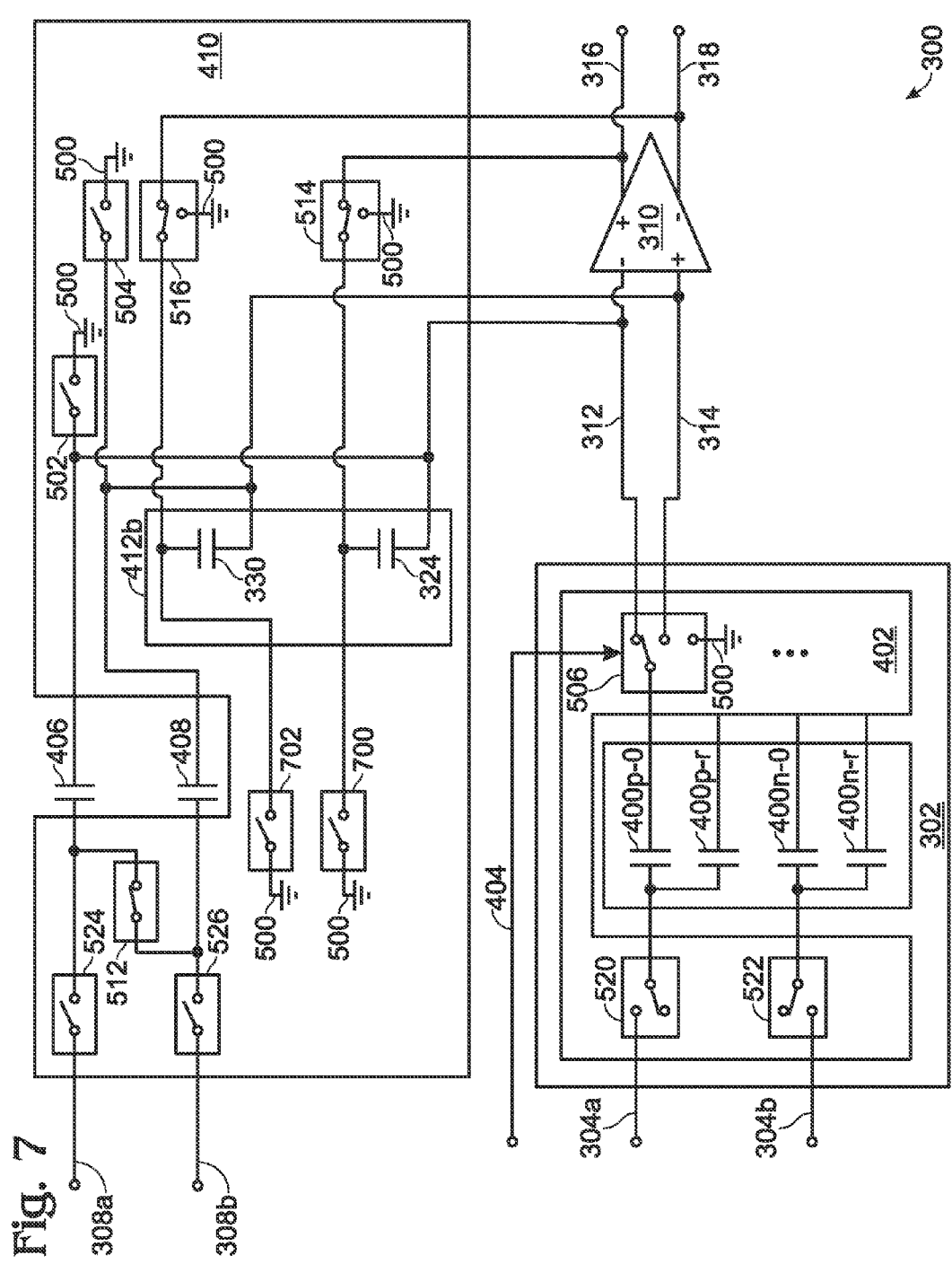
FIG. 7 is a schematic block diagram depicting the MDAC of FIG. 5 with a second variation in feedback capacitor sampling.

FIG. 7 is a schematic block diagram depicting the MDAC of FIG. 5 with a second variation in feedback capacitor sampling. The first and second terminals of the first feedback capacitor 324 accept a neutral reference voltage on line 500 in each sample clock cycle, respectively, via tenth switch 700 and first switch 502. The first and second terminals of the second feedback capacitor 330 accepts a neutral reference voltage on line 500, respectively, via eleventh switch 702 and second switch 504 in each sample clock cycle. Again, all switches are shown in the amplify clock cycle positions, and the switches that enable capacitors to be swapped between the first and second pair of feedback capacitors are not shown.

Figure 8:
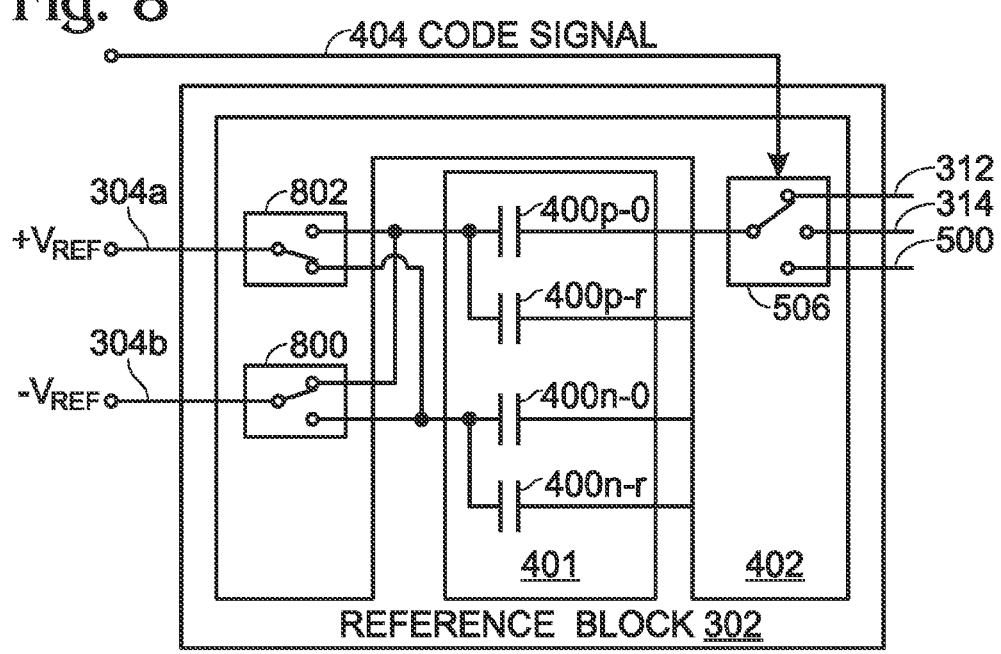
FIG. 8 is a schematic block diagram depicting the MDAC of FIGS. 4A and 4B with a first variation to the reference block.

FIG. 8 is a schematic block diagram depicting the MDAC of FIGS. 4A and 4B with a first variation to the reference block. In one aspect, the first terminal of each positive reference capacitor 400p-0 through 400p-r is connected to –Vref on line 304b via twelfth switch 800, and the first terminal of each negative reference capacitor 400n-0 through 400n-r is connected to +Vref on line 304a via thirteenth switch 802 each amplify clock cycle. All switches are shown in the amplify clock cycle position. This variation of the reference block 302 can be used with either feedback section 412a or 412b.

Figure 9:
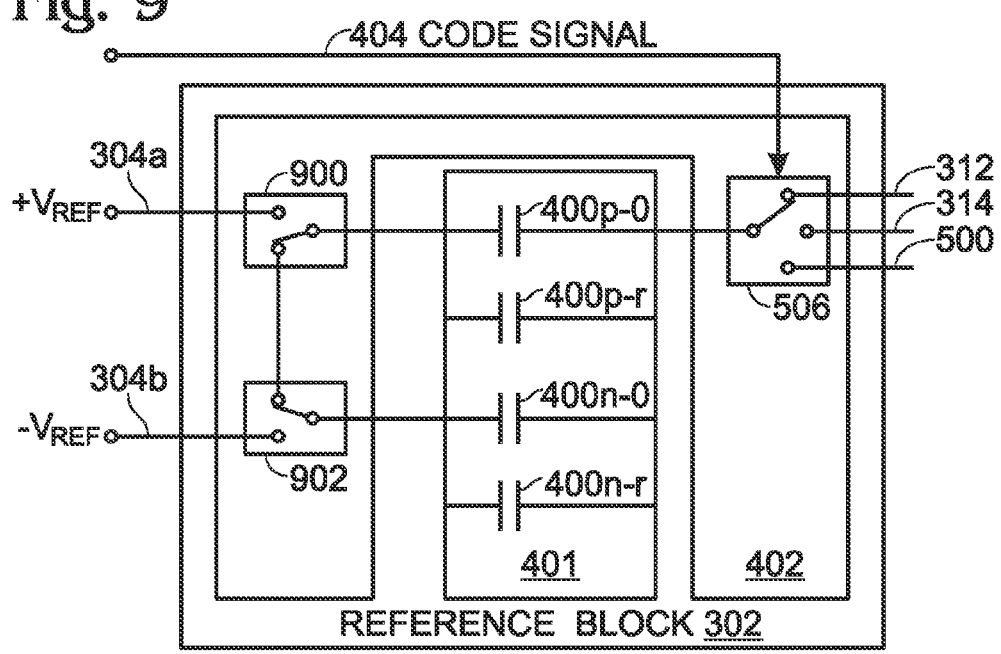
FIG. 9 is a schematic block diagram depicting the MDAC of FIGS. 4A and 4B with a second variation to the reference block.

FIG. 9 is a schematic block diagram depicting the MDAC of FIGS. 4A and 4B with a second variation to the reference block. In this aspect, a plurality of switches connect the first terminal of each positive reference capacitor to the first terminal of a corresponding negative reference capacitor in each amplify clock cycle. For the sake of simplicity, only two switches are shown, the fourteenth switch 900 and the fifteenth switch 902 connect the first terminal of positive reference capacitor 400p-0 to the first terminal of negative reference capacitor 400n-0. However, it should be understood that each reference capacitor is associated with such a switch. All switches are shown in the amplify clock cycle position. This variation of the reference block 302 can be used with either feedback section 412a or 412b.

Figure 10:
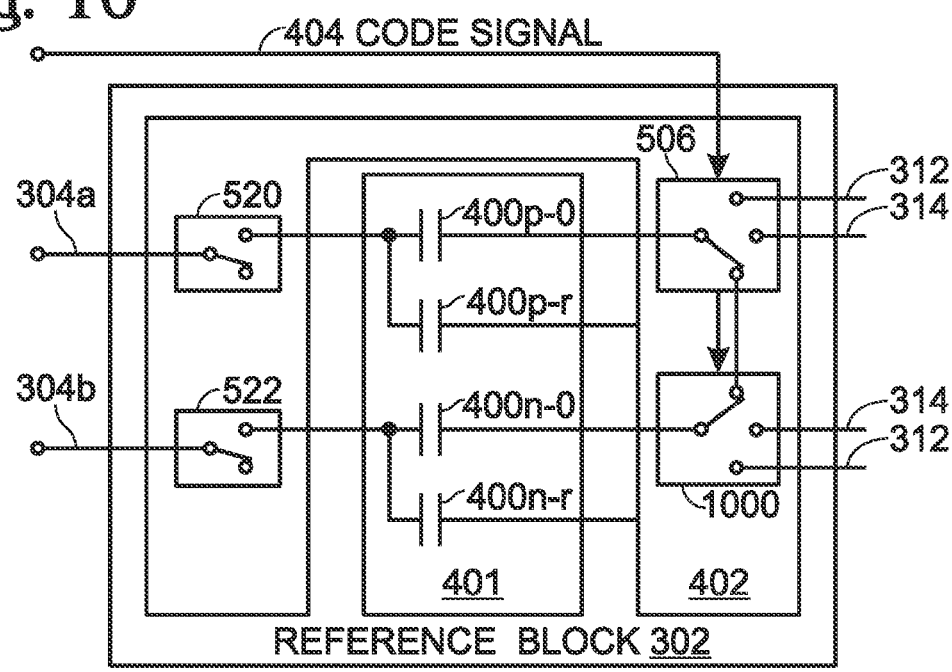
FIG. 10 is a schematic block diagram depicting the MDAC of FIGS. 4A and 4B with a third variation to the reference block.

FIG. 10 is a schematic block diagram depicting the MDAC of FIGS. 4A and 4B with a third variation to the reference block. In this aspect, the first switching section first plurality of switches selectively connects the second terminal of each positive and negative reference capacitor to the neutral reference voltage in each amplify clock cycle by selectively connecting the second terminal of each positive reference capacitor to the second terminal of a corresponding negative reference capacitor. For the sake of simplicity, the second terminal of only positive reference capacitor 400p-0 is shown connected to the second terminal of negative reference capacitor 400n-0 via switches 506 and 1000. However, it should be understood that each reference capacitor is associated with such a switch. The switches are shown in the amplify clock cycle position when the code signal selects a neutral voltage for reference capacitors 400p-0 and 400n-0. This variation of the reference block 302 can be used with either feedback section 412a or 412b.

In one variation, the first switching section 402 first plurality of switches (e.g., switches 506 and 1000) connects the neutral reference voltage to the second terminals of positive and negative reference capacitors in each sample clock cycle by connecting the second terminals of positive reference capacitors (e.g. positive reference capacitor 400p-0) to the second terminals of corresponding negative reference capacitors (e.g. negative reference capacitor 400n-0). However, it should be understood that each reference capacitor is associated with such a switch. Although not shown in this figure, switches 520 and 522 would be in closed position in the sample clock cycle, connecting the positive reference capacitors to line 304a and the negative reference capacitors to line 304b.

Figure 11A:
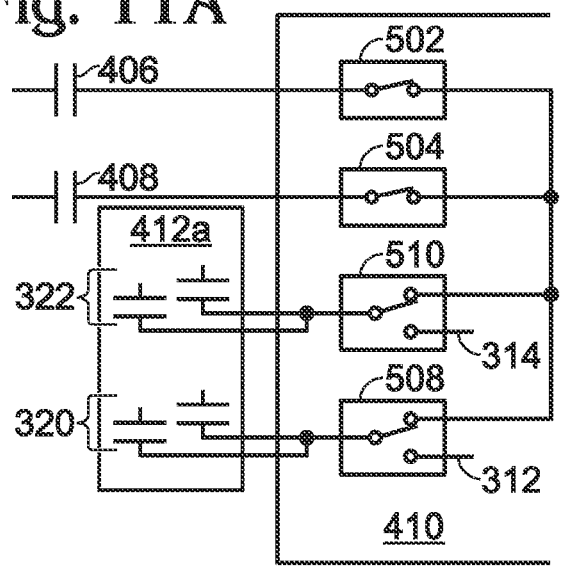
FIGS. 11A through 11B are schematic block diagrams depicting the MDAC of FIGS. 4A and 4B with variations to the sampling block.
Figure 11B:
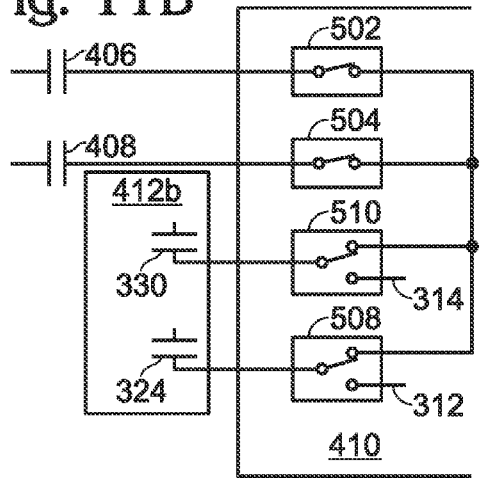

FIGS. 11A through 11B are schematic block diagrams depicting the MDAC of FIGS. 4A and 4B with variations to the sampling block. In FIG. 11A, the second switching section 410 first switch 502, second switch 504, third switch 508, and fourth switch 510 respectively connect the neutral reference voltage to the second terminals of the first input capacitor 406, the second input capacitor 408, the first pair of feedback capacitors 320, and the second pair of feedback capacitors 322 in each sample clock cycle by connecting together the second terminals of the first input capacitor, the second input capacitor, the first pair of feedback capacitors, and the second pair of feedback capacitors. FIG. 11A depicts the feedback section 412a, while FIG. 11B depicts feedback section 412b.

Some key features of the above-described MDAC are as follows:

1. The use of separate capacitors for references and sampling the input signal. This makes it possible to decouple the reference voltage range from the input signal range and internal signal range. It also makes possible signal independent reference loading and elimination of nonlinear charge kickback to MDAC input.

2. Determining the reference value to be fed into the amplifier by altering to which amplifier input the capacitor is connected, instead of altering the reference voltage to which the capacitor is connected.

3. Double sampling the reference by first charging the capacitors to the reference voltages during the sampling phase and connecting them to the complementary reference voltage instead of grounding them in the amplification phase.

4. When a zero reference needs to be generated the capacitors are operated as they are with positive or negative reference case with the distinction that they are not connected to the amplifier input, but rather, shorted together during the amplification phase.

5. The use of a reference voltage higher than the MDAC differential output voltage swing. The prior art uses a reference voltage that is equal to the differential output signal swing.

6. The sampling capacitors are divided in two subsets. The input voltage is sampled into both sets during the sampling phase and the first set is grounded (or shorted together in a differential implementation) and the second set is connected in feedback around the amplifier in the amplification phase.

7. The capacitors in the feedback set are further divided in two equal subsets. Which subset is used in the positive half circuit and which one in the negative half circuit defines two capacitor configurations that are alternated every clock cycle. This arrangement cancels the charge on a capacitor that was previously connected to the MDAC positive output with an opposite charge on a capacitor that was previously connected to the negative output when the capacitors are brought together to take a new input sample in the sampling phase.

FIGS. 12A through 12D are schematic block diagrams depicting the MDAC of FIG. 4A, as a two effective bit pipeline stage, over two complete clock cycles of operation. These figures illustrate Point 7, mentioned above. In the sample phase or sample clock cycle of Clock 1 (FIG. 12A) three positive reference capacitors 400p accept reference voltage +Vref, and three negative reference capacitors 400n accept −Vref. Here, the terminology "3×C/8" is intended to represent three capacitors in parallel, each have a relative value of C/8. Simultaneously, first input capacitor 406 with a value of 3C/4, first feedback capacitor 324, and second feedback capacitor 326, with values of C/4, accept +Vin. Likewise, second input capacitor 408, third feedback capacitor 328, and fourth feedback capacitor 330 accept −Vin.

Figure 12A:
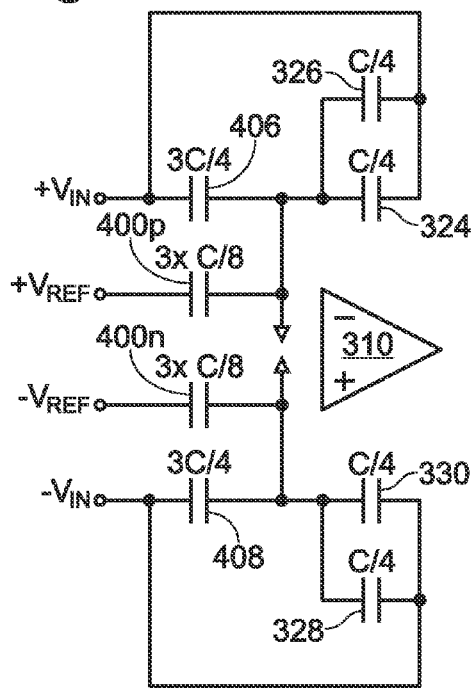
FIGS. 12A through 12D are schematic block diagrams depicting the MDAC of FIG. 4A, as a two effective bit pipeline stage, over two complete clock cycles of operation.
Figure 12B:
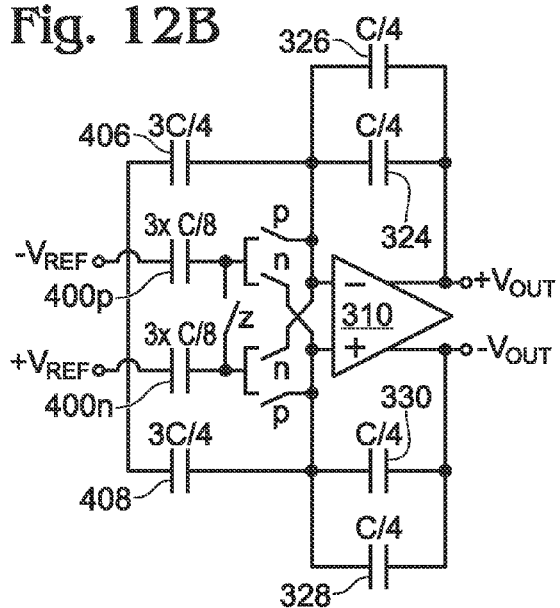
Figure 12C:
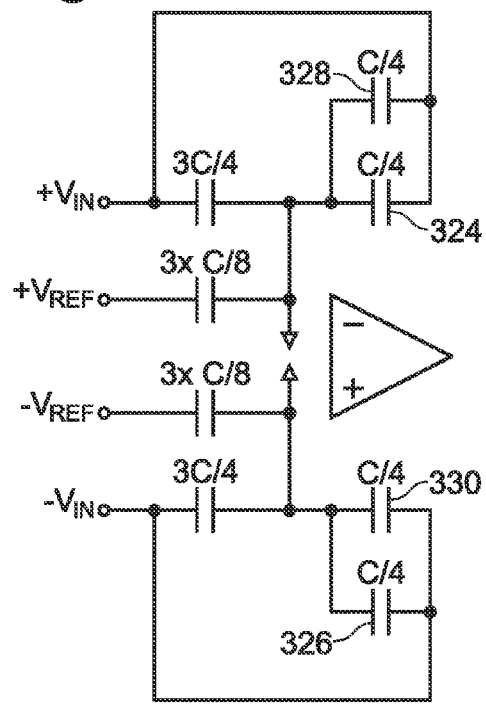
Figure 12D:
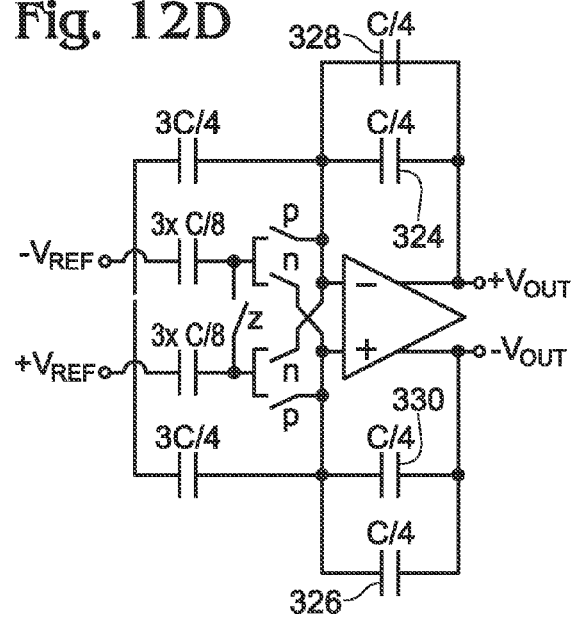

In the amplify phase or amplify clock cycle of Clock 1, the second terminals of first feedback capacitor 324 and second feedback capacitor 326 are connected to the positive output of differential amplifier 310, the second terminals of third feedback capacitor 328 and fourth feedback capacitor 330 are connected to the negative output of differential amplifier 310, and the first terminals of the first input capacitor 406 and second input capacitor 408 are connected together. In the sample and amplify clock cycles of Clock 2 (FIGS. 12C and 12D) the process of FIGS. 12A and 12B are repeated, except that second feedback capacitor 326 has been exchanged for third feedback capacitor 328, prior to the sample clock cycle of Clock 2.

Figure 13A:
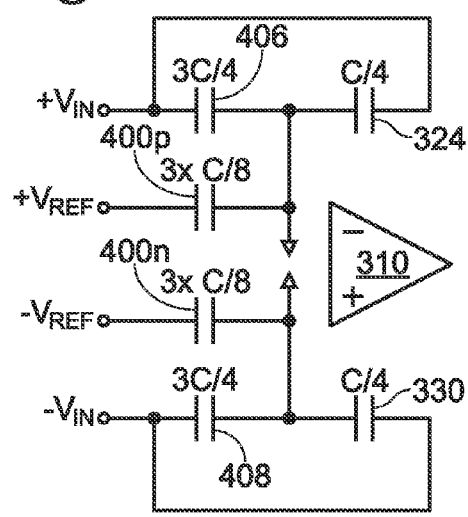
FIGS. 13A through 13B are schematic block diagrams depicting the MDAC of FIG. 9, as a two effective bit pipeline stage, over one complete clock cycle of operation.
Figure 13B:
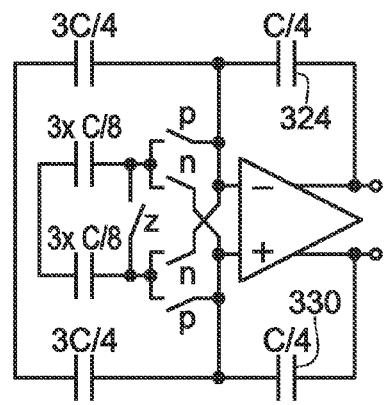

FIGS. 13A through 13B are schematic block diagrams depicting the MDAC of FIG. 9, as a two effective bit pipeline stage, over one complete clock cycle of operation. These figures illustrate Points 1, 2, 4, and 5, mentioned above. In the sample phase or sample clock cycle (FIG. 13A) three positive reference capacitors 400p accept reference voltage +Vref, and three negative reference capacitors 400n accept −Vref. Simultaneously, first input capacitor 406 and first feedback capacitor 324, accept +Vin. Likewise, second input capacitor 408 and fourth feedback capacitor 330 accept −Vin. In the amplify clock cycle (FIG. 13B) the first terminals of the first input capacitor 406 and second input capacitor 408 are connected together. Further, the first terminals of the positive reference capacitors 400p and connected to the first terminals of the negative reference capacitors.

Figure 14A:
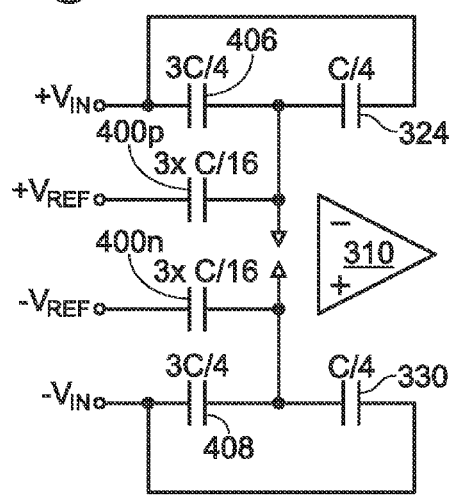
FIGS. 14A through 14B are schematic block diagrams depicting the MDAC of FIG. 8, as a two effective bit pipeline stage, over one complete clock cycle of operation.
Figure 14B:
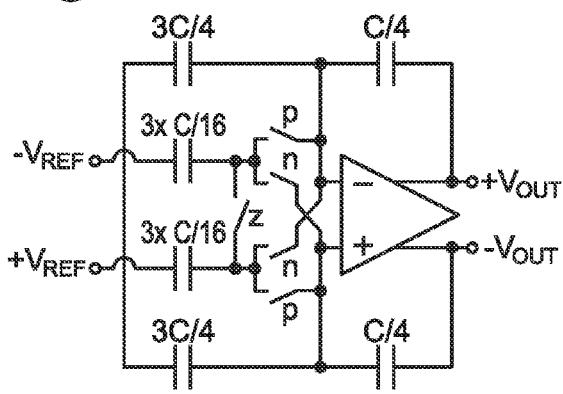

FIGS. 14A through 14B are schematic block diagrams depicting the MDAC of FIG. 8, as a two effective bit pipeline stage, over one complete clock cycle of operation. These figures illustrate Points 1, 2, 3, 4, and 5, mentioned above. In the sample phase or sample clock cycle (FIG. 14A) three positive reference capacitors 400p accept reference voltage +Vref, and three negative reference capacitors 400n accept −Vref. Simultaneously, first input capacitor 406 and first feedback capacitor 324, accept +Vin. Likewise, second input capacitor 408 and fourth feedback capacitor 330 accept −Vin. In the amplify clock cycle (FIG. 14B) the first terminals of the first input capacitor 406 and second input capacitor 408 are connected together. Further, the first terminals of the positive reference capacitors 400p are connected to −Vref, and the first terminals of the negative reference capacitors are connected to +Vref.

Figure 15A:
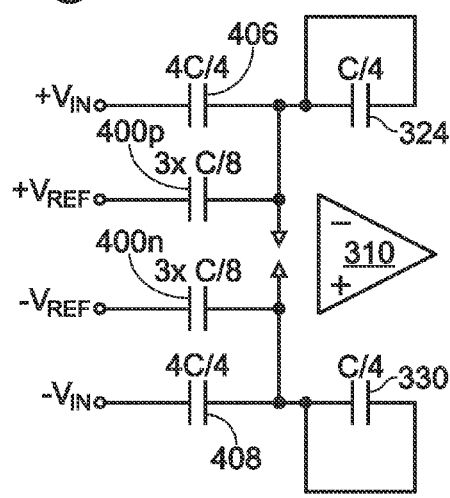
FIGS. 15A through 15B are schematic block diagrams depicting the MDAC of FIGS. 7 and 9, as a two effective bit pipeline stage, over one complete clock cycle of operation.
Figure 15B:
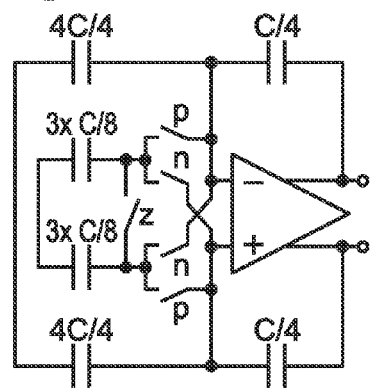

FIGS. 15A through 15B are schematic block diagrams depicting the MDAC of FIGS. 7 and 9, as a two effective bit pipeline stage, over one complete clock cycle of operation. In the sample phase or sample clock cycle (FIG. 15A) three positive reference capacitors 400p accept reference voltage +Vref, and three negative reference capacitors 400n accept −Vref. Simultaneously, first input capacitor 406 accepts +Vin. Likewise, second input capacitor 408 accepts −Vin. Both terminals of the first feedback capacitor 324 and second feedback capacitor 300 are connected to a neutral voltage. In the amplify clock cycle (FIG. 15B) the first terminals of the first input capacitor 406 and second input capacitor 408 are connected together. Further, the first terminals of the positive reference capacitors 400p are connected to −Vref, and the first terminals of the negative reference capacitors are connected to +Vref.

Various configurations of a MDAC have been presented. Examples of particular switch configurations and neutral reference voltages have been presented to illustrate the invention. However, the invention is not limited to merely these examples. Other variations and embodiments of the invention will occur to those skilled in the art.

We claim:

1. A charge canceling multiplying digital-to-analog converter (MDAC), the MDAC comprising:
    a reference block having inputs to accept reference voltages each sample clock cycle;
    a sampling block having inputs to accept differential analog input voltage signals each sample clock cycle; and,
    a differential amplifier having a negative input and positive input connected to the reference block and sampling block to receive differential amplifier input signals, and a positive output and a negative output to supply differential output voltage signals in each amplify clock cycle;
    wherein the sampling block comprises a first pair of feedback capacitors connected between the differential amplifier negative input and positive output, and a second pair of feedback capacitors connected between the differential amplifier positive input and negative output; and,
    wherein a capacitor from the first pair of feedback capacitors is swapped with a capacitor from the second pair of feedback capacitors prior to each sample clock cycle.

2. The MDAC of claim 1 wherein the first pair of feedback capacitors comprise a first feedback capacitor and a second feedback capacitor, engaged between the differential amplifier negative input and positive output, each developing a charge in a first amplify clock cycle, and wherein the second pair of feedback capacitors comprise a third feedback capacitor and a fourth feedback capacitor, engaged between the differential amplifier positive input and negative output, each developing a charge in the first amplify clock cycle; and,
    wherein the first pair of feedback capacitors comprise the first and third feedback capacitors, engaged between the differential amplifier negative input and positive output, respectively canceling their charges prior to a second sample clock cycle, and wherein the second pair of feedback capacitors comprise the second and fourth feedback capacitors, engaged between the differential amplifier positive input and negative output, respectively canceling their charges prior to the second sample clock cycle.

3. The MDAC of claim 2 wherein the first, second, third, and fourth feedback capacitors have equivalent capacitance values.

4. The MDAC of claim 1 wherein the reference block comprises:
    reference capacitors to accept the reference voltages in each sample clock cycle, independent of the differential analog input voltage signals;
    a first switching section having an input to accept a code signal and switches to selectively connect the reference capacitors to the differential amplifier inputs in response to the code signal each amplify clock cycle; and,
    wherein the sampling block further comprises:
        a first input capacitor and a second input capacitor to accept the differential analog input voltage signal each sample clock cycle; and,
        a second switching section to swap the capacitor from the first pair of feedback capacitors with the capacitor from the second pair of feedback capacitors prior to every sample clock cycle, to connect the first and second input capacitors, respectively, to the negative and positive inputs of the differential amplifier each amplify clock cycle, and to connect the first and second pair of feedback capacitors to the differential amplifier each amplify clock cycle.

5. The MDAC of claim 4 wherein the reference capacitors comprise:
    a first plurality of positive reference capacitors, each having a first terminal and a second terminal
    a first plurality of negative reference capacitors, each having a first terminal and a second terminal
    wherein the first switching section comprises:
    switches to connect a positive reference voltage (+Vref) to the positive reference capacitor first terminals and a neutral reference voltage to the positive reference capacitor second terminals in each sample clock cycle;
    switches to connect a negative reference voltage (−Vref) to the negative reference capacitor first terminals and a neutral reference voltage to the negative reference capacitor second terminals in each sample clock cycle;
    wherein the first input capacitor has a first terminal to accept a positive differential analog voltage input signal (+Vin) in each sample clock cycle;
    wherein the second input capacitor has a first terminal to accept a negative differential analog voltage input signal (−Vin) in each sample clock cycle;
    wherein the second switching section comprises:
    a first switch to connect a second terminal of the first input capacitor and the second terminals of the first pair of feedback capacitors to a neutral reference voltage in every sample clock cycle;
    a second switch to connect a second terminal of the second input capacitor and the second terminals of the second pair of feedback capacitors to a neutral reference voltage in every sample clock cycle;
    a third switch to connect the first terminals of the first pair of feedback capacitors to accept +Vin each sample clock cycle;
    a fourth switch to connect the first terminals of the second pair of feedback capacitors to accept −Vin each sample clock cycle;
    wherein the first switching section comprises:
    a plurality of switches to selectively connect, in each amplify clock cycle, the second terminal of each positive and negative reference capacitor to a node selected from a group consisting of the differential amplifier positive input, the differential amplifier negative input, and a neutral reference voltage, in response to the code signal;
    wherein the second switching section comprises:
    a fifth switch connecting the second terminal of the first input capacitor and second terminals of the first pair of feedback capacitors to the differential amplifier negative input in each amplify clock cycle;
    a sixth switch connecting the second terminal of the second input capacitor and second terminals of the second pair of feedback capacitors to the differential amplifier positive input in each amplify clock cycle;
    a seventh switch connecting the first terminal of the first input capacitor to the first terminal of the second input capacitor in each amplify clock cycle;
    an eighth switch connecting first terminals of the first pair of feedback capacitors to the differential amplifier positive output in each amplify clock cycle; and,
    a ninth switch connecting first terminals of the second pair of feedback capacitors to the differential amplifier negative output in each amplify clock cycle.

6. The MDAC of claim 5 wherein the first switching section connects the first terminal of each positive reference capacitor to −Vref, and the first terminal of each negative reference capacitor to +Vref, each amplify clock cycle.

7. The MDAC of claim 5 wherein the first switching section further comprises:

a plurality of switches to connect the first terminal of each positive reference capacitor to the first terminal of a corresponding negative reference capacitor in each amplify clock cycle.

8. The MDAC of claim 5 wherein the first switching section first plurality of switches selectively connects the second terminal of each positive and negative reference capacitor to the neutral reference voltage in each amplify clock cycle by connecting the second terminal of each positive reference capacitor to the second terminal of a corresponding negative reference capacitor.

9. The MDAC of claim 5 wherein the first switching section first plurality of switches connects the neutral reference voltage to the second terminals of positive and negative reference capacitors in each sample clock cycle by connecting the second terminals of positive reference capacitors to the second terminals of corresponding negative reference capacitors; and,
  wherein the second switching section first switch, second switch, fifth switch, and sixth switch respectively connect the neutral reference voltage to the second terminals of the first input capacitor, the second input capacitor, the first pair of feedback capacitors, and the second pair of feedback capacitors in each sample clock cycle by connecting together the second terminals of the first input capacitor, the second input capacitor, the first pair of feedback capacitors, and the second pair of feedback capacitors.

10. The MDAC of claim 5 wherein the first switching section connects the positive and negative reference capacitor first terminals to accept, respectively, constant uniform values of +Vref and −Vref in all sample clock cycles.

11. The MDAC of claim 5 wherein the reference block accepts values of +Vref and −Vref in each sample clock cycle, defining a first voltage potential between +Vref and −Vref; and,
  wherein the differential amplifier supplies a differential output voltage signal +Vout and −Vout each amplify clock cycle, having a second maximum voltage potential, less than the first voltage potential.

12. A multiplying digital-to-analog converter (MDAC) using reference voltages decoupled from analog input voltage signals, the MDAC comprising:
  a differential amplifier having a positive input, a negative input, a positive output, and a negative output;
  a reference block comprising:
    reference capacitors to accept reference voltages each sample clock cycle, independent of differential analog input voltage signals; and,
    a first switching section having an input to accept a code signal and switches to selectively connect, in each amplify clock cycle, the reference capacitors to the differential amplifier inputs in response to the code signal;
  a sampling block comprising:
    a first input capacitor and a second input capacitor to accept the differential analog input voltage signal each sample clock cycle;
    a first feedback capacitor and a second feedback capacitor; and,
    a second switching section to connect the first and second input capacitors, respectively, to the negative and positive inputs of the differential amplifier each amplify clock cycle, and to connect the first feedback capacitor between the differential amplifier negative input and positive output, and the second feedback capacitor between the differential amplifier positive input and negative output each amplify clock cycle.

13. The MDAC of claim 12 wherein the reference capacitors comprise:
  a first plurality of positive reference capacitors, each having a first terminal and a second terminal
  a first plurality of negative reference capacitors, each having a first terminal and a second terminal
  wherein the first switching section comprises:
  switches to connect a positive reference voltage (+Vref) to the positive reference capacitor first terminals and a neutral reference voltage to the positive reference capacitor second terminals in each sample clock cycle;
  switches to connect a negative reference voltage (−Vref) to the negative reference capacitor first terminals and a neutral reference voltage to the negative reference capacitor second terminals in each sample clock cycle;
  wherein the first switching section comprises:
  a plurality of switches to selectively connect, in each amplify clock cycle, the second terminal of each positive and negative reference capacitor to a node selected from a group consisting of the differential amplifier positive input, the differential amplifier negative input, and a neutral reference voltage, in response to the code signal;
  wherein the first input capacitor has a first terminal to accept a positive differential analog voltage input signal (+Vin) in each sample clock cycle;
  wherein the second input capacitor has a first terminal to accept a negative differential analog voltage input signal (−Vin) in each sample clock cycle;
  wherein the second switching section comprises:
  a first switch to connect a second terminal of the first input capacitor to a neutral reference voltage in every sample clock cycle;
  a second switch to connect a second terminal of the second input capacitor to a neutral reference voltage in every sample clock cycle;
  a third switch connecting the second terminal of the first input capacitor and a second terminal of the first feedback capacitor to the differential amplifier negative input in each amplify clock cycle;
  a fourth switch connecting the second terminal of the second input capacitor and a second terminal of the second feedback capacitor to the differential amplifier positive input in each amplify clock cycle;
  a fifth switch connecting the first terminal of the first input capacitor to the first terminal of the second input sampling capacitor in each amplify clock cycle;
  a sixth switch connecting a first terminal of the first feedback capacitor to the differential amplifier positive output in each amplify clock cycle; and,
  a seventh switch connecting a first terminal of the second feedback capacitor to the differential amplifier negative output in each amplify clock cycle.

14. The MDAC of claim 13 wherein the second switching section connects the first terminal of the first feedback capacitor to accept +Vin and the second terminal to accepts a neutral reference voltage in each sample clock cycle; and,
  wherein the second switching section connects the first terminal of the second feedback capacitor to accept −Vin and the second terminal accepts a neutral reference voltage in each sample clock cycle.

15. The MDAC of claim 13 wherein the second switching section connects the first and second terminals of the first feedback capacitor to accept a neutral reference voltage in each sample clock cycle; and, wherein the second switching section connects the first and second terminals of the second feedback capacitor to accept a neutral reference voltage in each sample clock cycle.

16. The MDAC of claim 13 wherein the first switching section connects the first terminal of each positive reference capacitor to −Vref, and the first terminal of each negative reference capacitor to +Vref in each amplify clock cycle.

17. The MDAC of claim 13 wherein the first switching section further comprises:
- a plurality of switches to connect the first terminal of each positive reference capacitor to the first terminal of a corresponding negative reference capacitor in each amplify clock cycle.

18. The MDAC of claim 13 wherein the first switching section first plurality of switches selectively connects the second terminal of each positive and negative reference capacitor to the neutral reference voltage in each amplify clock cycle by connecting the second terminal of each positive reference capacitor to the second terminal of a corresponding negative reference capacitor.

19. The MDAC of claim 13 wherein the first switching section first plurality of switches connects the neutral reference voltage to the second terminals of positive and negative reference capacitors in each sample clock cycle by connecting the second terminals of positive reference capacitors to the second terminals of corresponding negative reference capacitors; and,
- wherein the second switching section first switch, second switch, third switch, and fourth switch respectively connect the neutral reference voltage to the second terminals of the first input capacitor, the second input capacitor, the first feedback capacitor, and the second feedback capacitor in each sample clock cycle by connecting together the second terminals of the first input capacitor, the second input capacitor, the first feedback capacitor, and the second feedback capacitor.

20. The MDAC of claim 13 wherein the first switching section connects the positive and negative reference capacitor first terminals to accept, respectively, constant uniform values of +Vref and −Vref in all sample clock cycles.

21. The MDAC of claim 13 wherein the reference block accepts values of +Vref and −Vref in each sample clock cycle, defining a first voltage potential between +Vref and −Vref; and,
- wherein the differential amplifier supplies a differential output voltage signal +Vout and −Vout each amplify clock cycle, having a second maximum voltage potential, less than the first voltage potential.

22. The MDAC of claim 13 wherein the first feedback capacitor and second feedback capacitor are, respectively, a first pair of feedback capacitors and a second pair of feedback capacitors; and,
- wherein the second switching section comprises switches to swap a capacitor from the first pair of feedback capacitors with a capacitor from the second pair of feedback capacitors prior to every sample clock cycle.

* * * * *